US009799427B2

(12) United States Patent
Kanagawa

(10) Patent No.: US 9,799,427 B2
(45) Date of Patent: Oct. 24, 2017

(54) WIRE HARNESS AND METHOD FOR PRODUCING WIRE HARNESS

(71) Applicant: Sumitomo Wiring Systems, Ltd., Yokkaichi, Mie (JP)

(72) Inventor: Shuuichi Kanagawa, Mie (JP)

(73) Assignee: Sumitomo Wiring Systems, Ltd., Yokkaichi, Mie (JP)

(*) Notice: Subject to any disclaimer, the term of this patent is extended or adjusted under 35 U.S.C. 154(b) by 0 days.

(21) Appl. No.: 15/036,380

(22) PCT Filed: Nov. 6, 2014

(86) PCT No.: PCT/JP2014/079447
§ 371 (c)(1),
(2) Date: May 12, 2016

(87) PCT Pub. No.: WO2015/079881
PCT Pub. Date: Jun. 4, 2015

(65) Prior Publication Data

US 2016/0268019 A1 Sep. 15, 2016

(30) Foreign Application Priority Data

Nov. 27, 2013 (JP) ................................ 2013-244631

(51) Int. Cl.
*H05K 9/00* (2006.01)
*H01B 7/18* (2006.01)
(Continued)

(52) U.S. Cl.
CPC ....... *H01B 7/1805* (2013.01); *B60R 16/0207* (2013.01); *B60R 16/0215* (2013.01);
(Continued)

(58) Field of Classification Search
CPC .......................... H05K 9/0081; H05K 9/0098
See application file for complete search history.

(56) References Cited

U.S. PATENT DOCUMENTS 5,194,692 A * 3/1993 Gallusser ................ H01R 4/72 156/48
2002/0062975 A1* 5/2002 Matsunaga ......... B60R 16/0207 174/72 A (Continued)

FOREIGN PATENT DOCUMENTS

JP 1988143862 U 9/1988
JP WO2006106971 A1 10/2006

(Continued)

OTHER PUBLICATIONS

International Search Report and Written Opinion for Application No. PCT/JP2014/073301 dated Oct. 28, 2014, 7 pages.

(Continued)

*Primary Examiner* — Hung V Ngo
(74) *Attorney, Agent, or Firm* — Reising Ethington, P.C.

(57) ABSTRACT

A lighter and more space-saving wire harness that has a function of retaining the shape of part of electric wires and an electromagnetic shield function. The wire harness includes a plurality of spliced and sheathed electric wires and a conductive shielding member. Each of the spliced and sheathed electric wires has a spliced core wire and an insulating sheath that covers the spliced core wire. The spliced core wire includes a first core wire that is a single conductive wire, and a second core wire that is a bundle of a plurality of conductive wires that are thinner and shorter than the first core wire, the second core wire being connected to an end portion of the first core wire. The shielding member is formed in a flexible tubular shape, and collectively covers the plurality of spliced and sheathed electric wires.

8 Claims, 5 Drawing Sheets

(51) Int. Cl.

| | |
|---|---|
| ***H02G 3/04*** | (2006.01) |
| ***B60R 16/02*** | (2006.01) |
| ***H01B 7/00*** | (2006.01) |
| ***H01B 7/02*** | (2006.01) |
| ***H01B 13/012*** | (2006.01) |
| ***H01B 13/06*** | (2006.01) |

(52) U.S. Cl.

CPC ......... *H01B 7/0045* (2013.01); *H01B 7/0216* (2013.01); *H01B 13/012* (2013.01); *H01B 13/062* (2013.01); *H02G 3/0468* (2013.01); *H05K 9/0081* (2013.01); *H05K 9/0098* (2013.01)

(56) References Cited

U.S. PATENT DOCUMENTS

2005/0011687 A1 1/2005 Yamaguchi
2009/0229880 A1 9/2009 Watanabe
2010/0126752 A1* 5/2010 Watanabe ............ H05K 9/0098 174/102 D
2013/0126232 A1* 5/2013 Sakuma ............... H01B 7/2825 174/72 A
2013/0248246 A1 9/2013 Oga

FOREIGN PATENT DOCUMENTS

JP 2009099356 A 5/2009
JP 2009140612 A 6/2009
JP 2010287537 A 12/2010
JP 2011168104 A 9/2011
JP 2011173456 A 9/2011
JP 2012125097 A 6/2012

OTHER PUBLICATIONS

English Translation of International Search Report for Application No. PCT/JP20141073301 dated Oct. 28, 2014, 2 pages.

* cited by examiner 10
35
5
34
3
4
2
7
72
71
7
6
2
4
33
1
5
3

WIRE HARNESS AND METHOD FOR PRODUCING WIRE HARNESS

CROSS REFERENCE TO RELATED APPLICATIONS

This application claims the priority of Japanese patent application JP2013-244631 filed on Nov. 27, 2013, the entire contents of which are incorporated herein.

TECHNICAL FIELD

The present invention relates to a wire harness having a function of retaining the shape of part of electric wires and an electromagnetic shield function.

BACKGROUND ART

Wire harnesses mounted in vehicles such as automobiles in many cases include tubular external cover materials for protecting electric wires. For example, in the case of wire harnesses attached to lower faces of supports such as floor plates of vehicles, metal protective pipes such as aluminum pipes or stainless steel pipes are often used as external cover materials having a shape retaining function and an electromagnetic shield function.

For example, the wire harnesses shown in JP2004-224156A and JP2011-173456A (Patent Documents 1 and 2)include protective pipes, and a deformable conductive tube attached to end portions of the protective pipes. Electric wires extend through the protective pipes and the conductive tube.

In the wire harnesses shown in Patent Documents 1 and 2, the conductive tube is provided so that a portion near the terminal ends of the electric wires, that is, a portion from ends of the protective pipes to the terminal ends is made deformable. Meanwhile, the protective pipes are fastened to an underfloor region of a vehicle, and retain the shape of the portion of the electric wires along the lower face of the vehicle floor.

In Patent Document 1, the conductive tube attached to end portions of the protective pipes is an iron flexible tube including an iron corrugated tube or a mesh-like shielding portion. In Patent Document 2, the conductive tube is a braided wire (shielding braided tube).

SUMMARY OF INVENTION

As shown in Patent Documents 1 and 2, a combination of metal protective pipes and a deformable conductive tube is effective as an external cover material having a function of retaining the shape of part of electric wires and an electromagnetic shield function. Meanwhile, there is a demand for lighter and more space-saving wire harnesses having a shape retaining function and an electromagnetic shield function.

However, metal protective pipes are heavier than flexible shielding members such as braided wires. Furthermore, appropriate gaps are necessary between metal protective pipes and a bundle of electric wires extending therethrough, which restricts saving space of the wire harnesses.

Accordingly, there is a demand for a shielding structure that is lighter and has better space efficiency than a shielding structure including metal protective pipes, in wire harnesses having a function of retaining the shape of part of electric wires and an electromagnetic shield function.

It is an object of the present design to realize a lighter and more space-saving wire harness having a function of retaining the shape of part of electric wires and an electromagnetic shield function.

A wire harness according to a first aspect includes a plurality of sheathed electric wires and a conductive shielding member. Each of the sheathed electric wires has a spliced core wire and an insulating sheath that covers the spliced core wire. The spliced core wire includes a first core wire that is a single conductive wire, and a second core wire that is a bundle of a plurality of conductive wires that are thinner and shorter than the first core wire, the second core wire being connected to an end portion of the first core wire. The shielding member is a member that is formed in a flexible tubular shape, and that collectively covers the plurality of sheathed electric wires.

A wire harness according to a second aspect is one aspect of the wire harness according to the first aspect. In the wire harness according to the second aspect, the insulating sheath of each of the sheathed electric wires is a continuous heat shrinkable tube that covers a region extending over the entire first core wire and the entire or part of the second core wire of the spliced core wire.

A wire harness according to a third aspect is one aspect of the wire harness according to the first or second aspect. The wire harness according to the third aspect further includes a non-conductive secondary sheath. The secondary sheath covers and bundles first electric wire primary sheath portions, which are those portions of the insulating sheaths of the plurality of sheathed electric wires that cover the first core wires.

A wire harness according to a fourth aspect is one aspect of the wire harness according to any one of the first to third aspects. The wire harness according to the fourth aspect further includes a non-conductive protective tube having an accordion-like structure. The protective tube surrounds the plurality of sheathed electric wires and the shielding member.

A wire harness according to a fifth aspect is one aspect of the wire harness according to any one of the first to fourth aspects. In the wire harness according to the fifth aspect, the shielding member is a braided wire having a structure obtained by braiding metal wires into a tubular shape, or a metallic cloth that is a metallic thread fabric.

In the above-described aspects, the first core wires forming part of the spliced core wires in the sheathed electric wires are so-called solid wires, and thus they are hardly deformed and their shape is easily retained. That is to say, the bundle of the plurality of sheathed electric wires respectively having the spliced core wires naturally has a function of retaining the shape of the portion including the first core wires, even without being placed through heavy and hard protective pipes such as metal pipes.

Meanwhile, in the sheathed electric wires having the spliced core wires, each portion including the second core wires forming a portion near a terminal end is constituted by a bundle of a plurality of thin wires, and thus this portion is flexible. In this case, it is possible to connect the terminal end portions of the second core wires to a connection counterpart device while deforming the portion including the second core wires in the sheathed electric wires. Thus, the terminal end portions of the second core wires can be easily connected. Note that the terminal end portions of the second core wires refer to end portions opposite to the side where connection is established to the first core wires.

In the above-described aspects, the shielding member in a flexible tubular shape has a function of shielding the bundle of the plurality of sheathed electric wires respectively having the spliced core wires from electromagnetic waves. The flexible shielding member is, for example, a braided wire having a structure obtained by braiding metal wires into a tubular shape, or a metallic cloth that is a metallic thread fabric, and thus it is lighter than a metal pipe.

Furthermore, the flexible shielding member can be deformed so as to be along the outer circumferential face of the bundle of the sheathed electric wires after the bundle of the sheathed electric wires is placed through the shielding member. Thus, at least when attaching the wire harness to a support, a large gap is not necessary between the flexible shielding member made of a material such as braided wire or metallic cloth and the bundle of the sheathed electric wires, as in the case of a metal protective pipe.

Thus, according to the above-described aspects, it is possible to realize a lighter and more space-saving wire harness having a function of retaining the shape of part of a bundle of a plurality of sheathed electric wires and an electromagnetic shield function.

Furthermore, according to the second aspect, the insulating sheath of each of the sheathed electric wires is a continuous heat shrinkable tube that covers a region extending over the entire first core wire and the entire or part of the second core wire of the spliced core wire. In this case, in the sheathed electric wire, a gap is unlikely to be generated from the outside of the insulating sheath inward to the core wires, and the core wires can be prevented from being corroded.

Furthermore, according to the third aspect, the non-conductive secondary sheath covers and bundles first electric wire primary sheath portions, which are those portions of the insulating sheaths of the plurality of sheathed electric wires that cover the first core wires. In this case, the portions including the first core wires (solid wires) of the plurality of sheathed electric wires are collectively bundled by the continuous secondary sheath, and thus the rigidity increases, and the shape retaining ability further increases.

Furthermore, according to the fourth aspect, the protective tube having an accordion-like structure protects the sheathed electric wires and the shielding member without impairing the flexibility of the portion including the second core wires in the sheathed electric wires. The wire harness including such a protective tube is effective, for example, when used in an environment such as an underfloor region of a vehicle where the sheathed electric wires may be damaged by foreign objects such as objects flying from the outside.

DESCRIPTION OF EMBODIMENT

Hereinafter, an embodiment will be described with reference to the attached drawings. The following embodiment is merely an example for working the invention, and is not meant to limit the technical scope of the invention.

Figure 1:
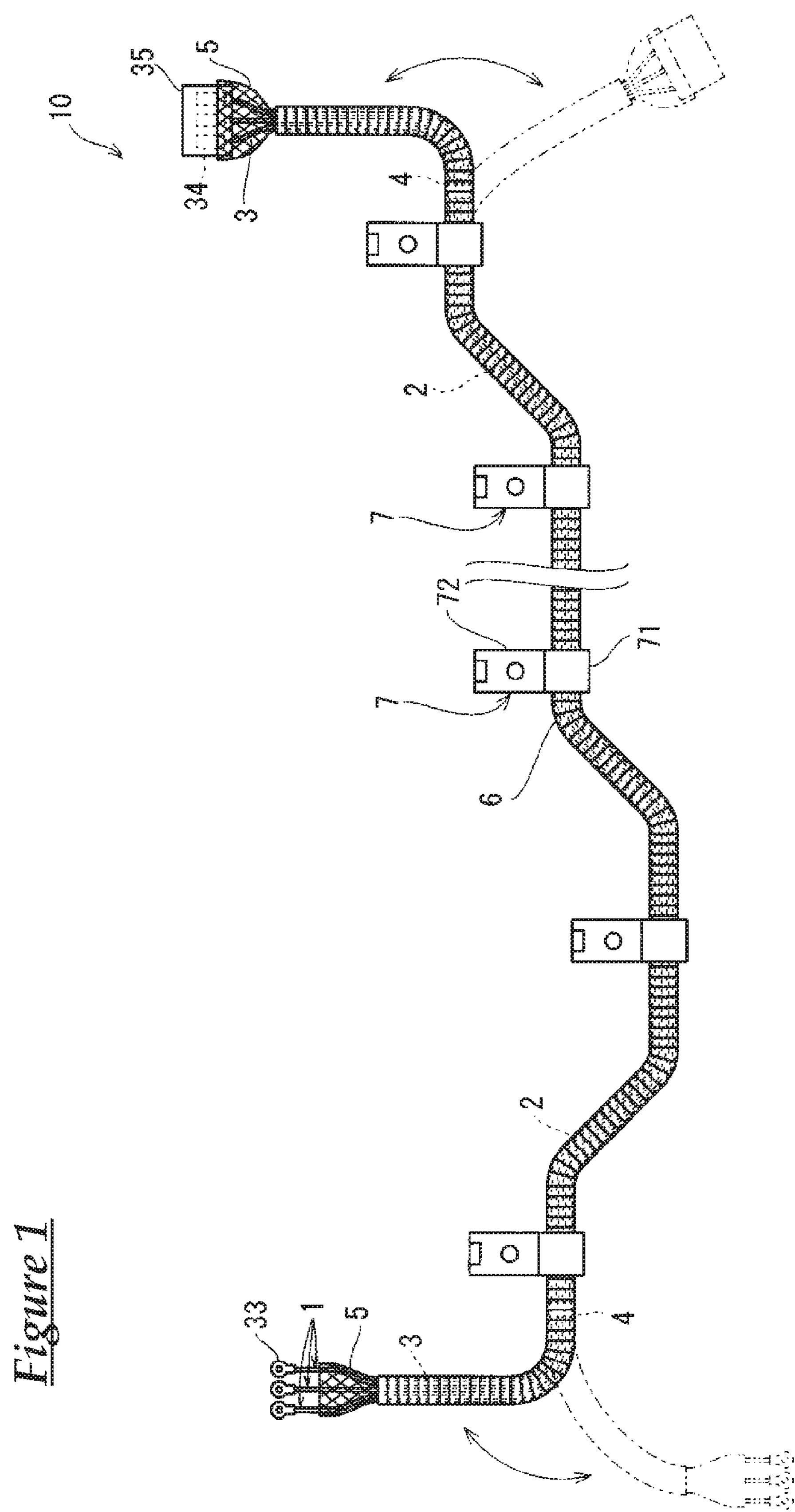
FIG. 1 is a schematic plan view of a wire harness 10 according to an embodiment.

First, a wire harness 10 according to an embodiment will be described with reference to FIGS. 1 to 6. As shown in FIG. 1, the wire harness 10 includes a plurality of spliced and sheathed electric wires 1 and a shielding member 5 that collectively covers a bundle of the plurality of spliced and sheathed electric wires 1.

In this embodiment, the wire harness 10 further includes a corrugated tube 6 that surrounds the plurality of spliced and sheathed electric wires 1 and the shielding member 5, and a plurality of fasteners 7.

Figure 2:
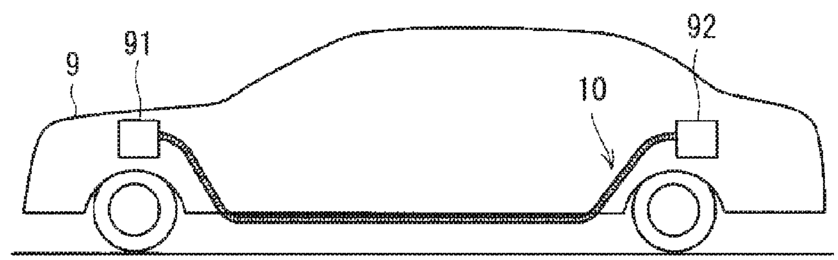
FIG. 2 is a view showing an example of the arrangement of the wire harness 10 in a vehicle.

As shown in FIG. 2, the wire harness 10 is attached, for example, in a state of extending via an underfloor region between a first device 91 and a second device 92 mounted in a vehicle 9 such as an automobile.

In the example shown in FIG. 2, the first device 91 is disposed in front of an interior of the vehicle 9, and the second device 92 is disposed behind the interior of the vehicle 9. For example, one of the first device 91 and the second device 92 is a battery, and the other is an inverter.

In the wire harness 10, the shape of the portion that is to be fastened to the underfloor region of the vehicle 9 has to be retained along the lower face of the floor. Meanwhile, in the wire harness 10, the portions respectively including the two terminal end portions that are to be connected to the first device 91 and the second device 92 have to be deformable so that the terminal end portions can be easily connected to the devices.

Figure 3:
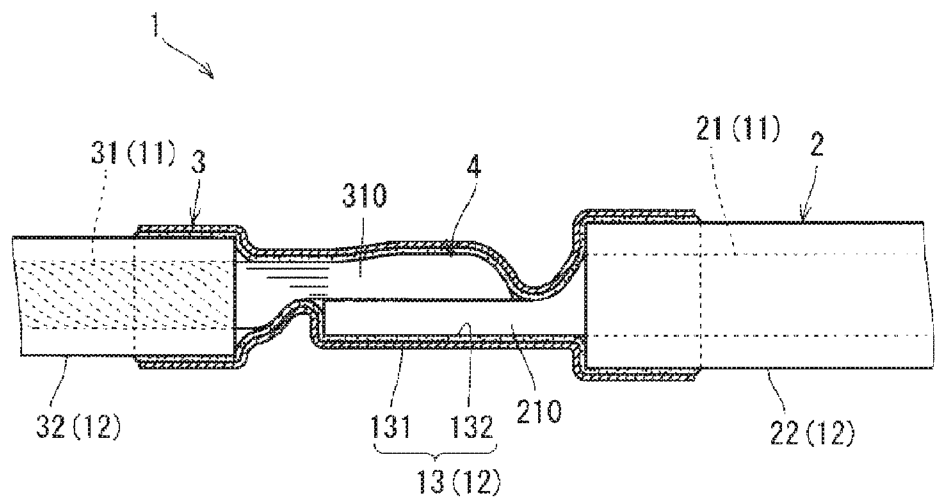
FIG. 3 is a partially cut-away side view of a portion including a core wire connection portion in a spliced and sheathed electric wire included in the wire harness 10.

As shown in FIG. 3, each of the spliced and sheathed electric wires 1 includes a spliced core wire 11, and an insulating sheath 12 that is a non-conductive sheath covering the spliced core wire 11. In the example shown in FIGS. 1 and 5, the wire harness 10 includes three spliced and sheathed electric wires 1. However, the wire harness 10 may include two spliced and sheathed electric wires 1, or may include four or more spliced and sheathed electric wires 1.

The spliced core wire 11 includes a first core wire 21 that is a single conductive wire, and a second core wire 31 that is shorter than the first core wire 21. The second core wire 31 is a bundle of a plurality of conductive wires 311 that are thinner and shorter than the first core wire 21. The second core wire 31 is, for example, a stranded wire having a structure in which a plurality of metal wires 311 are stranded. The first core wire 21 and the second core wire 31 are, for example, metal wires mainly made of copper, aluminum, or the like.

Figure 4:
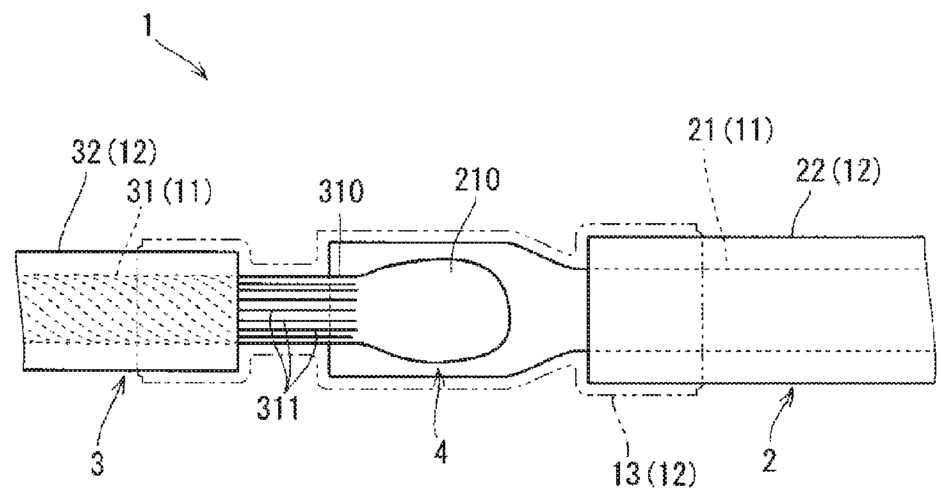
FIG. 4 is a plan view of the portion including the core wire connection portion in the spliced core wire included in the wire harness 10.
Figure 5:
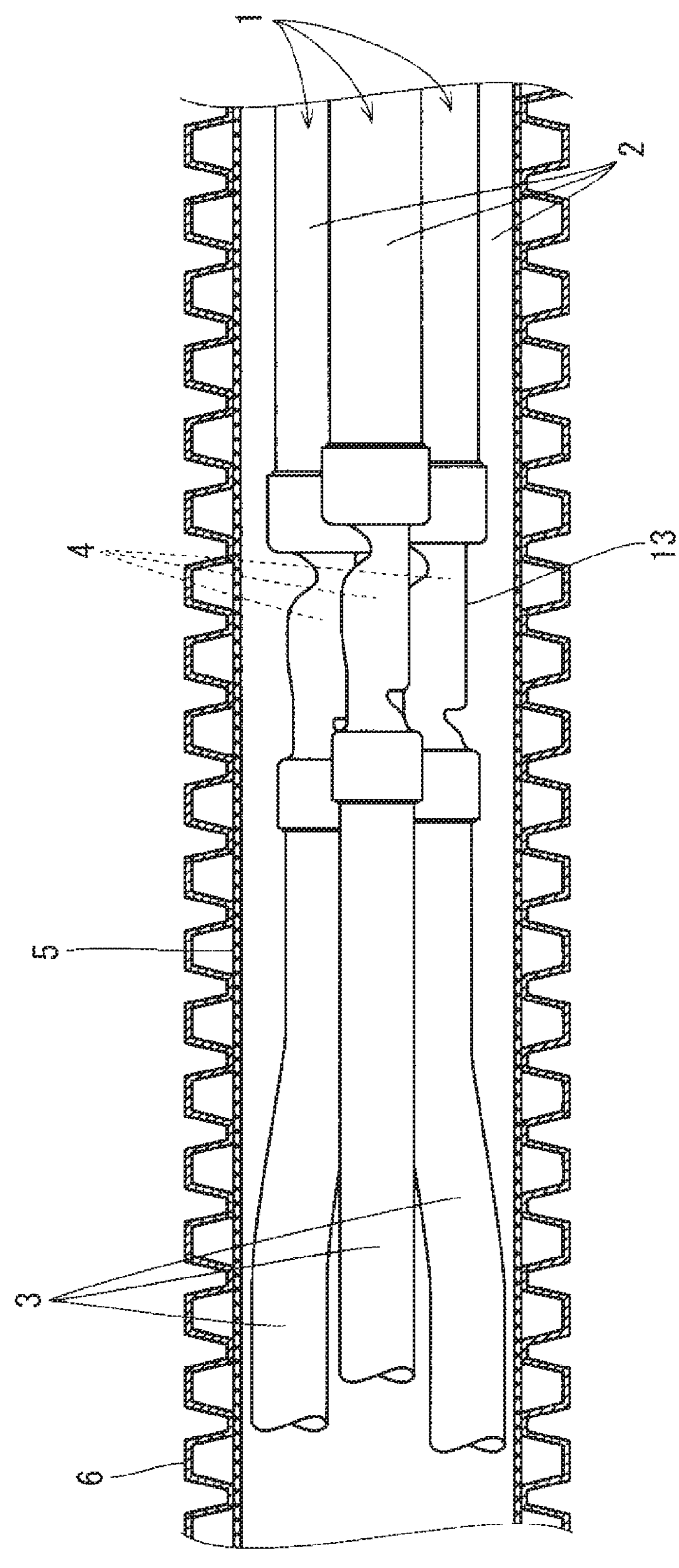
FIG. 5 is a partially cut-away side view of the portion including the core wire connection portion in the wire harness 10.

As shown in FIGS. 3 and 4, one end portion 310 of the second core wire 31 is connected to one end portion 210 of the first core wire 21. The spliced core wire 11 includes two second core wires 31 respectively connected to the two end portions 310 of the first core wire 21. In the description below, a portion where the end portion 210 of the first core wire 21 and the end portion 310 of the second core wire 31 are connected to each other is referred to as a core wire connection portion 4.

In the example shown in FIGS. 3 and 4, the core wire connection portion 4 is a portion in which the end portion 310 of one of the second core wires 31 is connected to the end portion 210 of the first core wire 21 by welding such as ultrasonic welding. It is also conceivable that the end portion 310 of the second core wire 31 is connected to the end portion 210 of the first core wire 21 by unshown crimp fittings.

In the example shown in FIGS. 3 and 4, the insulating sheath 12 of each of the spliced and sheathed electric wires 1 includes a first electric wire sheath portion 22 that covers the first core wire 21, a second electric wire sheath portion 32 that covers the second core wire 31, and a shrinkable insulating tube 13 that covers the core wire connection portion 4.

Note that FIG. 3 shows the spliced and sheathed electric wire 1 in which the insulating tube 13 is partially cut away. In FIG. 4, the insulating tube 13 is drawn with phantom lines (dashed double dotted lines).

More specifically, the spliced and sheathed electric wire 1 is an electric wire in which a first insulating electric wire 2 having the first core wire 21 and the first electric wire sheath portion 22 that covers the core wire is connected to two second insulating electric wires 3 including the second core wires 31 and the second electric wire sheath portions 32 that cover the core wires.

In the first insulating electric wire 2, the end portions 210 of the first core wire 21 protrude from ends of the first electric wire sheath portion 22. In a similar manner, in the second insulating electric wires 3, the end portions 310 of the second core wires 31 protrude from ends of the second electric wire sheath portions 32.

After each core wire connection portion 4 is formed, the shrinkable insulating tube 13 is attached to a region that encompasses the core wire connection portion 4, and the end portion of the first electric wire sheath portion 22 and the end portion of the second electric wire sheath portion 32. At that time, due to shrinkage the insulating tube 13, both end portions of the insulating tube 13 are in intimate contact with the entire outer circumferential face of the end portion of the first electric wire sheath portion 22 and the entire outer circumferential face of the end portion of the second electric wire sheath portion 32. Accordingly, the shrinkable insulating tube 13 seals the end portion 210 of the first core wire 21 and the end portion 310 of the second core wire 31.

In the example shown in FIG. 3, the shrinkable insulating tube 13 has a double-layered structure consisting of a heat shrinkable tube 131 and a thermoplastic adhesive 132 that is formed on the inner face of the tube. In the spliced and sheathed electric wire 1, the insulating tube 13 that has shrunk with the application of heat covers the core wire connection portion 4. Furthermore, the adhesive 132 causes the inner face of the heat shrinkable tube 131 to adhere to the end portion of the first electric wire sheath portion 22, the core wire connection portion 4, and the end portion of the second electric wire sheath portion 32.

The heat shrinkable tube 131 is a tubular member made of, for example, a synthetic resin such as polyolefin resin or nylon resin. The heat shrinkable tube 131 is obtained by a method in which a resin material is shaped by extrusion molding into a tube having a very small diameter, is stretched into a large-diameter tube while being heated, and is then cooled down. The thus obtained heat shrinkable tube 131 has shape-memory properties with which the tube shrinks with the application of heat into a small-diameter tube before being stretched.

In the example shown in FIG. 1, in the bundle of the plurality of spliced and sheathed electric wires 1, the portion in which the first core wires 21 are formed has a portion formed along a straight line (straight portion) and portions formed along curved lines (curved portions). Such a bundle of the spliced and sheathed electric wires 1 is obtained by partially bending the portion including the straight first core wires 21 of the bundle of the spliced and sheathed electric wires 1.

Note that, in the spliced and sheathed electric wires 1, the portions in which the second core wires 31 are formed, that is, the portions each of which is closer to the terminal end than the core wire connection portion 4 is, are flexible, and thus these portions can be relatively easily deformed.

In the example shown in FIG. 1, in each of the plurality of spliced and sheathed electric wires 1, a first terminal fitting 33 is connected to the terminal end portion of the second core wire 31 connected to one end portion of the first core wire 21, and a second terminal fitting 34 is connected to the terminal end portion of the second core wire 31 connected to the other end portion of the first core wire 21.

In the example shown in FIG. 1, the first terminal fittings 33 are of a type in which the terminal fittings are to be screwed to a connection counterpart. Meanwhile, the second terminal fittings 34 are terminal fittings that are to be accommodated in a cavity of a connector 35.

In a state where the wire harness 10 is attached to the vehicle 9, the first terminal fittings 33 and the second terminal fittings 34 are electrically connected to either the first device 91 or the second device 92.

In each of the plurality of spliced and sheathed electric wires 1, the first terminal fitting 33 may be connected to each of the terminal end portions of two second core wires 31, or the second terminal fitting 34 may be connected to each of the terminal end portions of two second core wires 31.

The shielding member 5 is a member that is formed in a flexible tubular shape, and collectively covers the plurality of spliced and sheathed electric wires 1. The shielding member 5 may be, for example, a braided wire having a structure obtained by braiding metal wires into a tubular shape. The metal wires forming the braided wire may be, for example, metal wire members mainly made of copper.

Alternatively, the shielding member 5 may be a metallic cloth that is a metallic thread fabric. In this case, the metallic cloth is used as the shielding member 5 in a state of being rolled into a tubular shape that collectively covers the plurality of spliced and sheathed electric wires 1. Furthermore, it is also conceivable that, in a state where a metallic cloth is rolled into a tubular shape, a pair of edge portions of the metallic cloth are joined to each other. Accordingly, the metallic cloth is kept in a tubular shape.

The metallic cloth is, for example, a material having a mesh structure obtained by weaving metallic threads mainly made of copper so as to intersect each other vertically and horizontally. Also, there are cases where the metallic cloth has a structure in which a flexible film made of a resin is affixed to a material made of metallic threads. The metallic cloth is conductive and flexible.

The shielding member 5 covers a region extending over the entire portion in which the first core wires 21 are formed and the entire or part of the portions in which the second core wires 31 are formed, in the bundle of the plurality of spliced and sheathed electric wires 1. For example, the shielding member 5 covers a region from one terminal end portion of the bundle of the plurality of spliced and sheathed electric wires 1 or a vicinity thereof, to the other terminal end portion or a vicinity thereof.

The corrugated tube 6 is an example of a non-conductive protective tube having an accordion-like structure. The corrugated tube 6 is, for example, a molded member made of a synthetic resin such as polyamide (PA), polypropylene (PP), polybutylene terephthalate (PBT), or ABS resin. The corrugated tube 6 is made of a material that is harder than that of the insulating sheaths 12 of the spliced and sheathed electric wires 1, but is bendable due to its accordion-like structure.

In the wire harness 10, the corrugated tube 6 surrounds the plurality of spliced and sheathed electric wires 1 and the shielding member 5. For example, the corrugated tube 6 surrounds an intermediate region of the bundle of the plurality of spliced and sheathed electric wires 1 excluding portions extending from both ends thereof, and an intermediate region of the shielding member 5 excluding portions extending from both ends thereof.

The corrugated tube 6 may have an unshown slit along the entire length thereof. In this case, the intermediate regions of the plurality of spliced and sheathed electric wires 1 and the shielding member 5 are inserted through that slit into the hollow portion of the corrugated tube 6.

In this embodiment, the fasteners 7, which will be described later, clip and hold the corrugated tube 6 at a plurality of points, thereby preventing the spliced and sheathed electric wires 1 and the shielding member 5 from sticking out from the slit of the corrugated tube 6. It is also conceivable that unshown binding members such as adhesive tapes or cable ties are wound around the corrugated tube 6. In this case, the binding members prevent the spliced and sheathed electric wires 1 and the shielding member 5 from sticking out from the slit of the corrugated tube 6.

It is also conceivable that the corrugated tube 6 has a fitting structure in which edge portions on both sides of the slit are engaged with each other. For example, the fitting structure may include a first projecting portion that is formed so as to project outward at the edge portion on one side of the slit and a second projecting portion that is formed so as to project outward at the edge portion on the other side of the slit. In this case, the first projecting portion is fitted to a recess on the inner side of the second projecting portion, and thus the edge portions on both sides of the slit of the corrugated tube 6 are engaged with each other.

The fasteners 7 are members that are fastened to a support such as a vehicle floor plate in a state of being attached to part of the corrugated tube 6. The corrugated tube 6 is fastened to the support via the fasteners 7.

Figure 6:
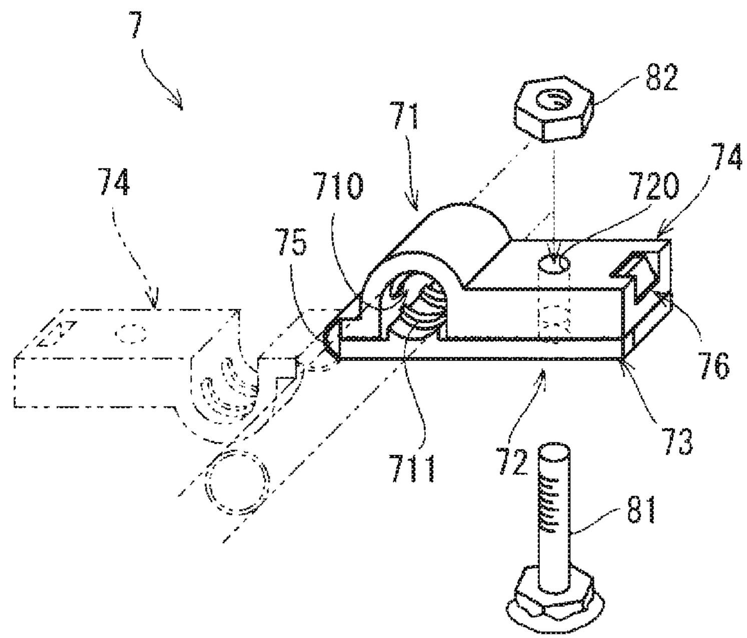
FIG. 6 is a perspective view of a fastener included in the wire harness 10.

As shown in FIG. 6, each of the fasteners 7 includes a tube connection portion 71 that is connected to part of the corrugated tube 6, and a fastenable portion 72 that can be fastened to the support. 64 also indicates a stud bolt 81 and a nut 82 for fastening the fastenable portion 72 of the fasteners 7 to the support.

The fastener 7 is, for example, a molded member made of a synthetic resin such as polyamide (PA), polypropylene (PP), polybutylene terephthalate (PBT), or ABS resin. Alternatively, the fastener 7 may be a metal member.

In the example shown in FIG. 6, the fastener 7 includes a first side portion 73 and a second side portion 74 that sandwich part of the corrugated tube 6 therebetween, and a hinge portion 75 that couples these side portions in a relatively rotatable manner.

Part of the first side portion 73 and part of the second side portion 74 form a lock portion 76 in which they are locked to each other to keep the first side portion 73 and the second side portion 74 combined with each other. The first side portion 73 and the second side portion 74 are combined with each other in a state of sandwiching part of the corrugated tube 6 therebetween.

When combined with each other, the first side portion 73 and the second side portion 74 form the tube connection portion 71 and the fastenable portion 72.

In the example shown in FIG. 6, the tube connection portion 71 sandwiches part of the corrugated tube 6 so as to be connected to the corrugated tube 6. Thus, the tube connection portion 71 forms a tube passing hole 710 that allows the corrugated tube 6 to pass therethrough.

Furthermore, the inner face of the tube passing hole 710 of the tube connection portion 71 is provided with projections 711 that are to be fitted into recesses on the outer circumferential face of the corrugated tube 6. Accordingly, the fastener 7 is prevented from being displaced with respect to the corrugated tube 6. Meanwhile, the fastenable portion 72 is a portion provided with a fastening hole 720 that allows the stud bolt 81 to pass therethrough.

In the example shown in FIG. 1, the wire harness 10 includes a plurality of fasteners 7 that are respectively attached to a plurality of points on the corrugated tube 6. In the wire harness 10, the portion in which the first core wires 21 are formed is attached to the vehicle 9, for example, so as to extend in the vehicle 9 from an accommodation portion of the first device 91 via the underfloor region to an accommodation portion of the second device 92.

In the wire harness 10, the first core wires 21 forming part of the spliced core wires 11 in the spliced and sheathed electric wires 1 are so-called solid wires, and thus they are hardly deformed and their shape is easily retained. That is to say, the bundle of the plurality of spliced and sheathed electric wires 1 respectively having the spliced core wires 11 naturally has a function of retaining the shape of the portion including the first core wires 21, even without being placed through heavy and hard protective pipes such as metal pipes.

Meanwhile, in the spliced and sheathed electric wires 1 having the spliced core wires 11, each portion including the second core wires 31 forming a portion near a terminal end is constituted by a bundle of a plurality of thin wires 311, and thus this portion is flexible. In this case, it is possible to connect the terminal end portions of the second core wires 31 to a connection counterpart device (the first device 91 and the second device 92) while deforming the portion including the second core wires 31 in the spliced and sheathed electric wires 1. Thus, the terminal end portions of the second core wires 31 can be easily connected. Note that the terminal end portions of the second core wires 31 refer to end portions opposite to the side where connection is established to the first core wires 21.

In the wire harness 10, the shielding member 5 in a flexible tubular shape has a function of shielding the bundle of the plurality of spliced and sheathed electric wires 1 from electromagnetic waves. The flexible shielding member 5 is, for example, braided wire or metallic cloth, and thus it is lighter than a metal pipe.

Furthermore, the flexible shielding member 5 can be deformed so as to be along the outer circumferential face of the bundle of the spliced and sheathed electric wires 1 after the bundle of the spliced and sheathed electric wires 1 is placed through the shielding member 5. Thus, at least when attaching the wire harness 10 to a support, a large gap is not necessary between the flexible shielding member 5 made of a material such as braided wire or metallic cloth and the bundle of the sheathed electric wires, as in the case of a metal protective pipe.

Accordingly, if the wire harness 10 is used, it is possible to realize a lighter and more space-saving wire harness having a function of retaining the shape of part of the bundle of the plurality of spliced and sheathed electric wires 1 and an electromagnetic shield function.

Furthermore, in the wire harness 10, the corrugated tube 6 having an accordion-like structure protects the spliced and sheathed electric wires 1 and the shielding member 5 without impairing the flexibility of the portions including the second core wires 31 in the spliced and sheathed electric wires 1. The wire harness 10 including such a corrugated tube 6 is effective, for example, when used in an environment such as the underfloor region of the vehicle 9 where the spliced and sheathed electric wires 1 may be damaged by foreign objects such as objects flying from the outside.

Figure 7:
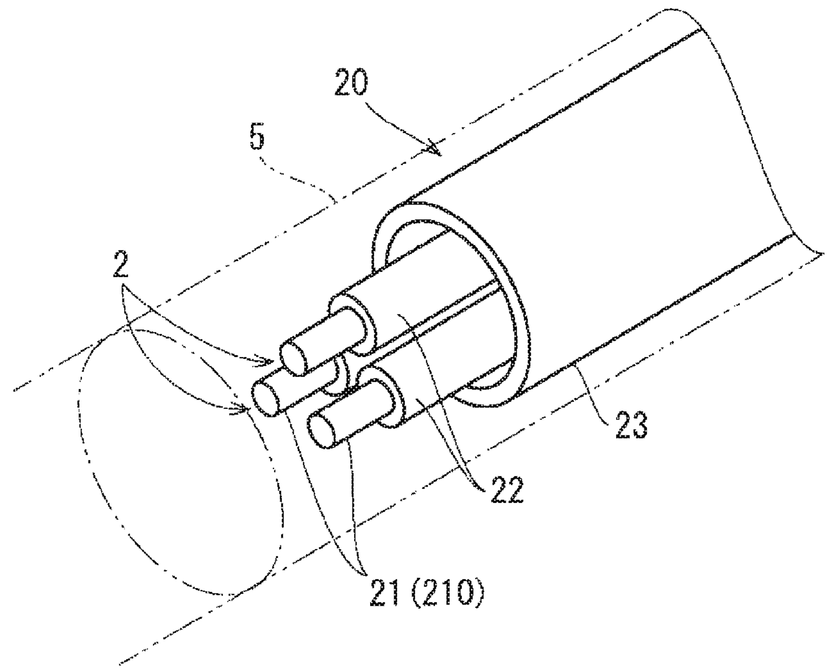
FIG. 7 is a perspective view of an end portion of the composite cable 20 according to the first application example that can be applied to the wire harness 10.

Next, a composite cable 20 according to a first application example that can be applied to the wire harness 10 will be described with reference to FIG. 7. FIG. 7 is a perspective view of an end portion of the composite cable 20. In FIG. 7, the shielding member 5 is drawn with phantom lines.

The composite cable 20 can be applied as a bundle of the plurality of first insulating electric wires 2 in the wire harness 10.

The composite cable 20 includes the plurality of first insulating electric wires 2 and a secondary sheath 23. The secondary sheath 23 covers a bundle of the plurality of first insulating electric wires 2, and bundles the first insulating electric wires 2.

In the first application example, the secondary sheath 23 has a tubular shape. For example, the secondary sheath 23 may be a synthetic resin member formed in a tubular shape by extrusion molding around the bundle of the plurality of first insulating electric wires 2. The secondary sheath 23 may be a heat shrinkable tube that has shrunk with the application of heat.

As described above, the first electric wire sheath portions 22 of the first insulating electric wires 2 are those portions of the insulating sheaths 12 of the plurality of spliced and sheathed electric wires 1 that cover the first core wires 21. In this application example, for the sake of convenience, the first electric wire sheath portions 22 are referred to as first electric wire primary sheath portions 22.

In the composite cable 20, the secondary sheath 23 covers a bundle of the first electric wire primary sheath portions 22, and bundles the first electric wire primary sheath portions 22. If the composite cable 20 is applied to the wire harness 10, the shielding member 5 collectively covers the plurality of spliced and sheathed electric wires 1 from the outside of the secondary sheath 23.

Although not shown in FIG. 7, in the composite cable 20, the end portions 210 of the plurality of first core wires 21 are respectively connected to the end portions 310 of the second core wires 31.

Figure 8:
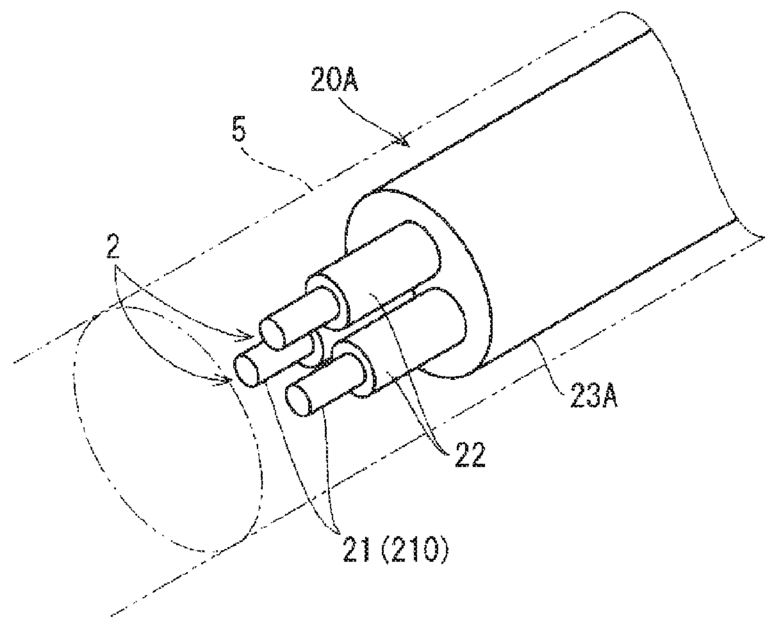
FIG. 8 is a perspective view of an end portion of a composite cable 20A according to a second application example that can be applied to the wire harness 10.

Next, a composite cable 20A according to a second application example that can be applied to the wire harness 10 will be described with reference to FIG. 8. FIG. 8 is a perspective view of an end portion of the composite cable 20A. In FIG. 8, the shielding member 5 is drawn with phantom lines.

The composite cable 20A can be applied as a bundle of the plurality of first insulating electric wires 2 in the wire harness 10.

The composite cable 20A includes the plurality of first insulating electric wires 2 and a secondary sheath 23A. The secondary sheath 23A covers a bundle of the plurality of first insulating electric wires 2, and bundles the first insulating electric wires 2. Also in this application example, for the sake of convenience, the first electric wire sheath portions 22 of the first insulating electric wires 2 are referred to as the first electric wire primary sheath portions 22.

In the composite cable 20A, the secondary sheath 23A covers a bundle of the first electric wire primary sheath portions 22, and bundles the first electric wire primary sheath portions 22. The secondary sheath 23A is molded into a shape in which it fills gaps between the plurality of first electric wire primary sheath portions 22. For example, the plurality of first electric wire primary sheath portions 22 and the secondary sheath 23A are sheaths molded simultaneously by extrusion molding around the plurality of first core wires 21.

If the composite cable 20A is applied to the wire harness 10, the shielding member 5 collectively covers the plurality of spliced and sheathed electric wires 1 from the outside of the secondary sheath 23A.

Although not shown in FIG. 8, in the composite cable 20A, the end portions 210 of the plurality of first core wires 21 are respectively connected to the end portions 310 of the second core wires 31.

If the composite cable 20 or 20A is applied to the wire harness 10, the portions including the first core wires 21 (solid wires) of the plurality of spliced and sheathed electric wires 1 are collectively bundled by the continuous secondary sheath 23, and thus the rigidity increases, and the shape retaining ability further increases.

Figure 9:
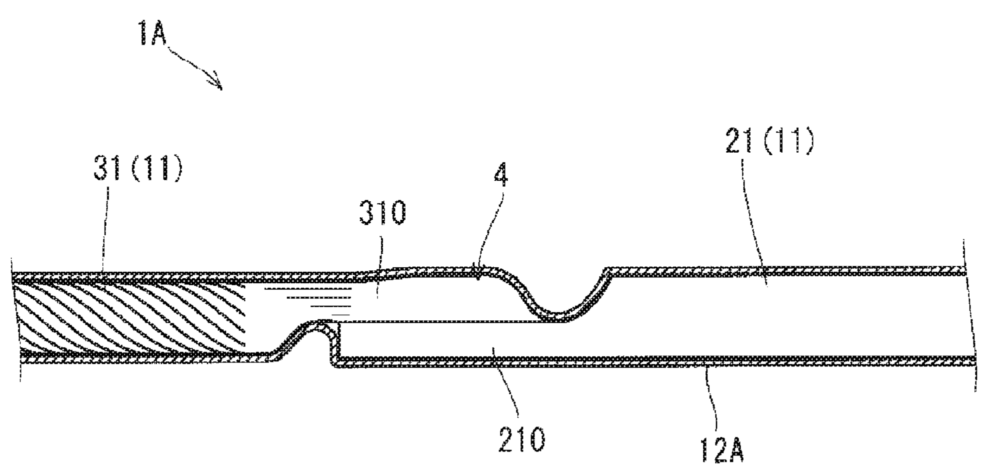
FIG. 9 is a partially cut-away side view of the portion including the core wire connection portion in a spliced and sheathed electric wire 1A according to an application example that can be applied to the wire harness 10.

Next, a spliced and sheathed electric wire 1A according to an application example that can be applied to the wire harness 10 will be described with reference to FIG. 9. FIG. 9 is a partially cut-away side view of the portion including the core wire connection portion 4 in the spliced and sheathed electric wire 1A. Note that FIG. 9 shows the spliced and sheathed electric wire 1A in which the insulating tube 13 is partially cut away.

Each spliced and sheathed electric wire 1A includes the spliced core wire 11 and an insulating sheath 12A that covers the spliced core wire 11. The insulating sheath 12A is a continuous heat shrinkable tube that covers a region extending over the entire first core wire 21 and the entire or part of the second core wires 31 of the spliced core wire 11.

The spliced and sheathed electric wire 1A as shown in FIG. 9 is obtained through a core wire connecting step and a covering step described below. The core wire connecting step is a step of connecting the end portion 210 of the first core wire 21 in a bare wire state and the end portion 310 of the second core wire 31 in a bare wire state. The covering step is a step of inserting the spliced core wire 11 obtained in the core wire connecting step into a heat shrinkable tube, and causing the heat shrinkable tube to shrink by the application of heat.

That is to say, the spliced and sheathed electric wire 1A is not obtained by connecting two insulating electric wires. The two long conductive members that are connected in the core wire connecting step are conductive members in a bare wire state with no sheath.

If this spliced and sheathed electric wire 1A is applied to the wire harness 10, the insulating sheath 12A of the spliced and sheathed electric wire 1A is a continuous heat shrinkable tube that covers a region extending over the entire first core wire 21 and the entire or part of the second core wires 31 of the spliced core wire 11. In this case, in the spliced and sheathed electric wire 1A, a gap is unlikely to be generated from the outside of the insulating sheath 12A inward to the first core wire 21 and the second core wires 31, and the first core wire 21 and the second core wires 31 can be prevented from being corroded.

Furthermore, if this spliced and sheathed electric wire 1A is used, it is not necessary to perform a peeling step of peeling off end portions of an insulating sheath of an insulating electric wire.

It is also conceivable that, in the wire harness 10, the shrinkable insulating tubes 13 are rubber tubes.

Furthermore, it is also conceivable that, in the wire harness 10, one or both of the corrugated tube 6 and the fasteners 7 are omitted.

Note that the wire harness according to the present invention can also be configured by freely combining the above-described embodiment and application examples or by appropriately modifying or omitting part of the embodiment or application examples, within the scope of the invention recited in the claims.

LIST OF REFERENCE NUMERALS

10 Wire harness
1, 1A Spliced and sheathed electric wire (sheathed electric wire)
11 Spliced core wire
12, 12A Insulating sheath
13 Insulating tube
131 Heat shrinkable tube
132 Adhesive
2 First insulating electric wire
20, 20A Composite cable
21 First core wire
210 End portion of first core wire
22 First electric wire sheath portion (first electric wire primary sheath portion)
23, 23A Secondary sheath
3 Second insulating electric wire
31 Second core wire
310 End portion of second core wire
311 Wire
32 Second electric wire sheath portion
33 First terminal fitting
34 Second terminal fitting
35 Connector
4 Core wire connection portion
5 Shielding member
6 Corrugated tube
7 Fastener
71 Tube connection portion
710 Tube passing hole
711 Projection
72 Fastenable portion
720 Fastening hole
73 First side portion
74 Second side portion
75 Hinge portion
76 Lock portion
81 Stud bolt
82 Nut
9 Vehicle
91 First device
92 Second device

The invention claimed is:

1. A wire harness, comprising:

a plurality of sheathed electric wires;

at least one of the plurality of sheathed electric wires has a spliced core wire, an insulating sheath covering the spliced core wire, and a core wire connection portion, the spliced core wire has a first core wire and a second core wire, the first core wire is a single solid conductive wire and the second core wire is a bundle of stranded conductive wires each of which is thinner than the single solid conductive wire of the first core wire, the bundle of stranded conductive wires of the second core wire is connected to the single solid conductive wire of the first core wire in the core wire connection portion; and a conductive shielding member that is formed in a flexible tubular shape, the conductive shielding member collectively covers the plurality of sheathed electric wires, wherein the insulating sheath is a continuous heat shrinkable tube that covers a region extending over the entire first core wire, across the core wire connection portion where the first core wire and the second core wire are spliced together, and over the entire second core wire.

2. The wire harness according to claim 1, further comprising a non-conductive secondary sheath that covers and bundles first electric wire primary sheath portions, which are those portions of the insulating sheaths of the plurality of sheathed electric wires that cover the first core wires.

3. The wire harness according to claim 2, further comprising a non-conductive protective tube that has an accordion-like structure and that surrounds the plurality of sheathed electric wires and the shielding member.

4. The wire harness according to claim 2, wherein the shielding member is a braided wire having a structure obtained by braiding metal wires into a tubular shape, or a metallic cloth that is a metallic thread fabric.

5. The wire harness according to claim 1, wherein the shielding member is a braided wire having a structure obtained by braiding metal wires into a tubular shape, or a metallic cloth that is a metallic thread fabric.

6. The wire harness according to claim 1, further comprising a non-conductive protective tube that has an accordion-like structure and that surrounds the plurality of sheathed electric wires and the shielding member.

7. The wire harness according to claim 6, wherein the shielding member is a braided wire having a structure obtained by braiding metal wires into a tubular shape, or a metallic cloth that is a metallic thread fabric.

8. A method for producing a wire harness, comprising:

a core wire connecting step of connecting an end portion of a first core wire that with an end portion of a second core wire in a core wire connection portion, the end portion of the first core wire is a single solid conductive wire in a bare wire state, and the end portion of the second core wire is a bundle of stranded conductive wires in a bare wire state where each of the stranded conductive wires of the second core wire is thinner and shorter than the single solid conductive wire of the first core wire; and a covering step of providing an insulating sheath that covers a spliced core wire including the first core wire and the second core wire and obtained in the wire connecting step, by inserting the spliced core wire into a continuous heat shrinkable tube, and causing the continuous heat shrinkable tube to shrink around the entire first core wire, the wire connection portion and the entire second core wire by application of heat.

* * * * *